United States Patent
Ren

(10) Patent No.: US 10,431,638 B2
(45) Date of Patent: Oct. 1, 2019

(54) ARRAY SUBSTRATE AND OLED DISPLAY DEVICE

(71) Applicant: BOE TECHNOLOGY GROUP CO., LTD., Beijing (CN)

(72) Inventor: Lijun Ren, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/366,201

(22) PCT Filed: Apr. 2, 2013

(86) PCT No.: PCT/CN2013/073596
§ 371 (c)(1),
(2) Date: Jun. 17, 2014

(87) PCT Pub. No.: WO2014/121550
PCT Pub. Date: Aug. 14, 2014

(65) Prior Publication Data
US 2015/0084019 A1    Mar. 26, 2015

(30) Foreign Application Priority Data

Feb. 5, 2013 (CN) .......................... 2013 1 0046249

(51) Int. Cl.
*H01L 23/48* (2006.01)
*H01L 27/32* (2006.01)

(52) U.S. Cl.
CPC ...... *H01L 27/3244* (2013.01); *H01L 27/3255* (2013.01)

(58) Field of Classification Search
CPC ... H01L 51/058; H01L 51/102; H01L 51/107; H01L 51/0516; H01L 51/052;
(Continued)

(56) References Cited

U.S. PATENT DOCUMENTS 5,672,083 A * 9/1997 Curtin .................. G02F 1/1333
445/25
2004/0245654 A1* 12/2004 Liu ......................... H01L 24/81
257/778

(Continued)

FOREIGN PATENT DOCUMENTS

| CN | 1743930 A | 3/2006 | |
|---|---|---|---|
| CN | 203055913 U | 7/2013 | |
| JP | 2011023376 A * | 2/2011 | ......... H01L 51/0024 |

OTHER PUBLICATIONS

International Search Report dated Oct. 24, 2013 PCT/CN2013073596.

(Continued)

*Primary Examiner* — Thomas L Dickey

(57) ABSTRACT

An array substrate and an organic light-emitting diode (OLED) display device are provided. The array substrate includes: a thin-film transistor (TFT) substrate and a plurality of driver integrated circuits (ICs), the TFT substrate includes a substrate and a plurality of pixel units disposed on one surface of the substrate; and the plurality of driver ICs are disposed on the other surface of the substrate and configured to transmit signals to the pixel units. In the array substrate, the driver ICs can have enough driving capability to drive the pixel units, so that the image brightness displayed by the OLED display device can become more uniform.

16 Claims, 2 Drawing Sheets

(58) Field of Classification Search
CPC . H01L 51/0525; H01L 27/32; H01L 27/3225; H01L 27/3234; H01L 27/3248; H01L 27/3251; H01L 27/3253; H01L 27/3258; H01L 27/3262; H01L 27/3274; H01L 2225/06541; H01L 21/76898; H01L 23/49827; H01L 23/5384; H01L 29/4175; H01L 27/14603; H01L 27/14614; H01L 27/14636; H01L 27/14812
See application file for complete search history.

(56) References Cited

U.S. PATENT DOCUMENTS

| | | | | |
|---|---|---|---|---|
| 2006/0066224 | A1* | 3/2006 | Ito | H01L 51/102 313/504 |
| 2009/0078939 | A1* | 3/2009 | Yamazaki | H01L 21/67144 257/59 |
| 2009/0321731 | A1* | 12/2009 | Jeong | H01L 29/4908 257/43 |
| 2010/0213560 | A1* | 8/2010 | Wang | H01L 27/14621 257/432 |
| 2011/0210355 | A1* | 9/2011 | Yamazaki | H01L 27/1225 257/98 |
| 2012/0273878 | A1* | 11/2012 | Mallikarjunaswamy | H01L 29/4175 257/335 |
| 2014/0184057 | A1* | 7/2014 | Kim | G06F 1/1637 313/504 |

OTHER PUBLICATIONS

First Chinese Office Action dated Jul. 3, 2014; Appln. No. 201310046249.1.
Second Chinese Office Action Appln. No. 201310046249.1; dated Feb. 27, 2015.
International Preliminary Report on Patentability Appln. No. PCT/CN2013/073596; dated Aug. 11, 2015.
Third Chinese Office Action Appln. No. 201310046249.1; dated Sep. 7, 2015.

* cited by examiner

US 10,431,638 B2

ARRAY SUBSTRATE AND OLED DISPLAY DEVICE

TECHNICAL FIELD

Embodiments of the present invention relate to an array substrate and an organic light-emitting diode (OLED) display device.

BACKGROUND

An OLED display is a new flat-panel display, has the advantages of simple manufacturing process, low cost, fast response speed, capability of easily realizing color display and large-screen display, low power consumption, capability of easily matching with an integrated circuit (IC) driver, high luminous brightness, wide application range of the working temperature, light and thin property, capability of achieving flexible display and the like, and hence has wide application prospects.

The driving modes for OLED display devices may be divided into two categories: passive matrix (PM) driving and active matrix (AM) driving. As a thin-film transistor (TFT) is disposed on a panel of an organic light-emitting diode display device of the active-matrix mode, pixel units can emit light within the time of one frame; in addition, the panel has the advantages of low driving current required, low power consumption and longer service life and hence can meet the requirements of large-resolution, multi-level gray and large-size display. Therefore, the traditional OLED display device generally adopts the active matrix driving mode. An array substrate of the traditional OLED display device of the active matrix driving comprises: a substrate, a plurality of pixel units disposed on the substrate, and a plurality of driver ICs disposed along the periphery of the substrate, and the plurality of driver ICs are in signal connection with the plurality of the pixel units.

The traditional array substrate has the defects: as the traditional OLED display device of the active matrix driving has a limited internal space, the driver ICs disposed along the periphery of the substrate cannot provide enough driving capability for the pixel units, and hence the image brightness displayed by the OLED display device is not uniform.

SUMMARY

Embodiments of the present invention provide an array substrate and an OLED display device, and the image brightness displayed by the OLED display device can become more uniform and hence the display effect can be improved.

In one aspect, the present invention provides an array substrate, which comprises a TFT substrate and a plurality of driver ICs, wherein the TFT substrate comprises a substrate and a plurality of pixel units disposed on one surface of the substrate; and the driver ICs are disposed on the other surface of the substrate and configured to transmit signals to the pixel units.

For instance, the pixel unit may comprise TFTs and pixel electrodes; and the TFTs comprise gate electrodes, active layers, source electrodes and drain electrodes.

For instance, the gate electrodes are disposed on the substrate; the active layers are disposed over the gate electrodes; channels are provided between the source electrodes and the drain electrodes; the drain electrodes are connected with the pixel electrodes; and the driver ICs transmit the signals to the pixel units through the source electrodes.

For instance, via holes provided with a conductive material are formed in the substrate.

For instance, the pixel units may further comprise a gate insulating layer disposed between the gate electrodes and the active layers; through holes corresponding to the via holes are formed in the gate insulating layer and provided with a conductive material; output ends of the driver ICs are in signal connection with the source electrodes through the conductive material.

For instance, the conductive material may be metal or graphite.

For instance, the pixel units may further comprise a protective layer disposed between the substrate and the gate electrodes; and through holes corresponding to the via holes are formed on the protective layer.

For instance, the driver ICs may be welded on the substrate.

For instance, the substrate may be a resin plate.

For instance, the array substrate may further comprise a passivation layer covering a plurality of the pixel units.

In another aspect, the present invention provides an OLED display device, which comprises the array substrate according to any one of the above examples.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

Figure 1:
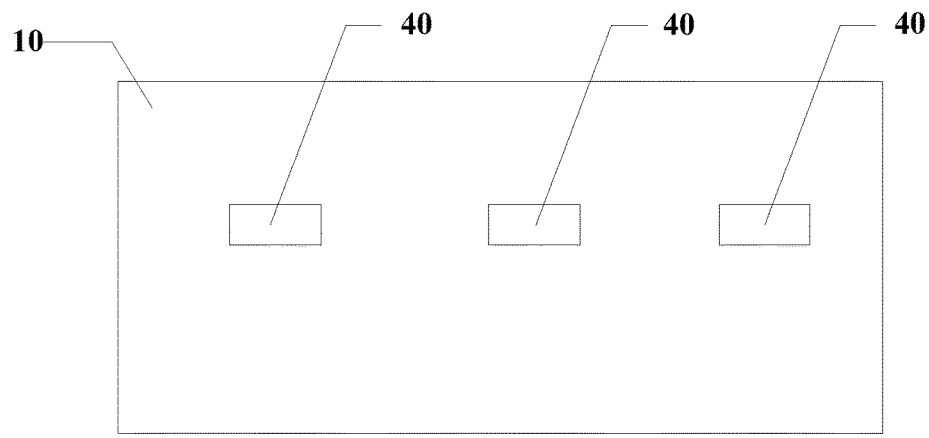
FIG. 1 is a schematic structural view of an array substrate provided by an embodiment of the present invention.

| Reference numerals of the accompanying drawings: | | |
|---|---|---|
| 10—TFT Substrate | 11—Transparent Substrate | 12—Pixel unit |
| 20—TFT | 21—Active Layer | 22—Gate Electrode |
| 23—Source Electrode | 24—Drain Electrode | 25—Through Hole |
| 26—Conductive Material | 27—Gate Insulating Layer | 29—passivation layer |
| 40—Driver IC | 28—protective layer | 30—Pixel Electrode |

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Unless otherwise defined, the technical or scientific terms used herein have normal meanings understood by those skilled in the art. The words "a", "an", "the" and the like also do not indicate the number but only indicate at least one. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "below", "left", "right" and the like only indicate the relative position relationship which is correspondingly changed when the absolute position of a described object is changed.

In order to improve the driving capability of an OLED display device so that the image brightness displayed by the OLED display device can become more uniform, an embodiment of the present invention provides an array substrate, in which a plurality of driver ICs are randomly disposed on a bottom surface of a TFT substrate, so that the driving capability of the OLED display device can be effectively improved, and hence the image brightness of the OLED display device can become more uniform.

Figure 2A:
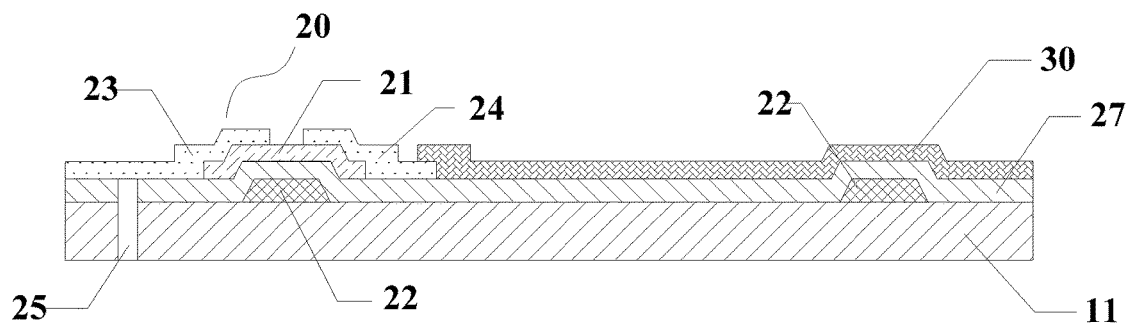
FIG. 2A is a schematic structural view of a pixel unit of the array substrate provided by an embodiment of the present invention.
Figure 3:
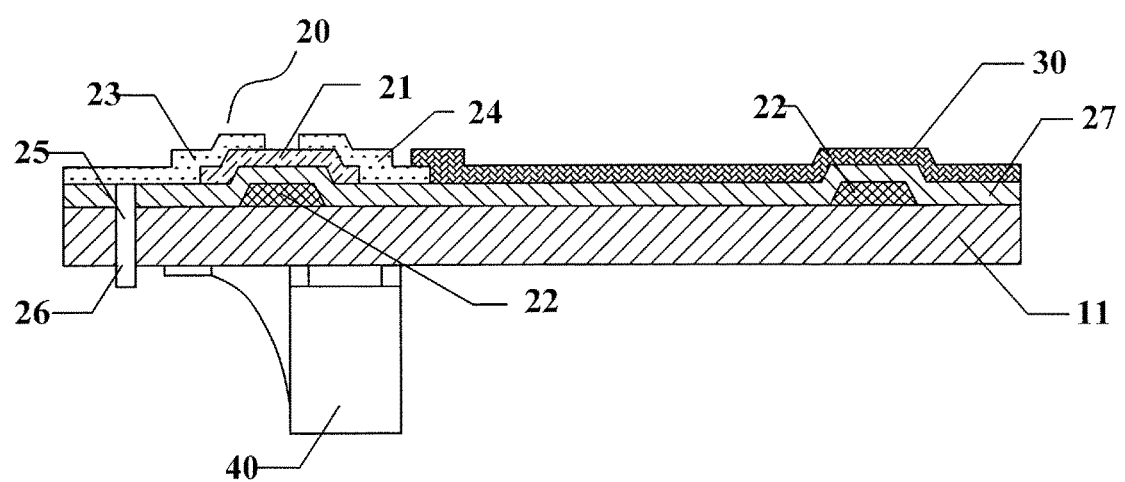
FIG. 3 is a schematic structural view illustrating the connection between the pixel unit and driver ICs.

FIG. 1 is a schematic structural view of the array substrate provided by the embodiment of the present invention; FIG. 2A is a schematic structural view of a pixel unit of the array substrate provided by the embodiment of the present invention; and FIG. 3 is a schematic structural view illustrating the connection between the pixel unit and the driver ICs.

As illustrated in FIG. 1, the array substrate provided by the embodiment of the present invention comprises: a TFT substrate 10 and a plurality of driver ICs 40, and the TFT substrate 10 comprises a transparent substrate 11 and a plurality of pixel units 12 disposed on one surface of the transparent substrate 11; and the driver ICs 40 are disposed on the other surface of the transparent substrate 11 and configured to transmit signals to the pixel units 12. The array substrate provided by the embodiment of the present invention may also adopt a nontransparent substrate. The present invention is not limited thereto.

In the embodiment, the plurality of the driver ICs 40 may be randomly fixed on a bottom surface of the transparent substrate 11. As the area of the bottom surface of the transparent substrate 11 is large enough, enough driver ICs 40 can be disposed to provide driving capability for the array substrate. In the embodiment, the array substrate may also be divided into a plurality of regions, and a driver IC 40 is disposed in each region, so that the driver ICs 40 can have enough driving capability to drive the pixel units 12, and hence the image brightness displayed by the OLED display device can become more uniform. The regions may have a same size and be uniformly distributed.

The array substrate of the embodiment, for instance, comprises pixel units arranged in an array (for instance, red, green and blue pixel units) and configured to display color images.

Subsequently, as illustrated in FIG. 2A, in the embodiment, the pixel unit 12 may comprise: a thin film transistor (TFT) 20 and a pixel electrode 30. The TFT 20, for instance, includes: a gate electrode 22, an active layer 21, a source electrode 23 and a drain electrode 24. The TFT 20 is of the bottom-gate type for instance, in which the gate electrode 22 is disposed on the top of the transparent substrate 11; the active layer 21 is disposed over the gate electrode 22; a channel is formed between the source electrode 23 and the drain electrode 24; the drain electrode 24 is connected with the pixel electrode 30; and the driver ICs 40 transmit signals to the pixel unit 12 via the source electrode 23. The pixel unit 12 further comprises a gate insulating layer 27 disposed between the gate electrode 22 and the active layer 21. The TFT 20 may, for instance, be of the bottom-gate type or the dual-gate type, and is, for instance, connected with the pixel electrode through the drain electrode.

When the array substrate is applied to an OLED display device, an organic emission layer of corresponding pixel unit and another electrode are formed on the pixel electrode 30. Where the pixel electrode 30 is taken as an anode, the other electrode is taken as a cathode; and where the pixel electrode 30 is taken as the cathode, the other electrode is taken as the anode.

In the embodiment, the driver ICs 40 may be fixed on the transparent substrate 11 of the pixel unit 12 by kinds of fixing means. For instance, the driver ICs 40 are welded on the transparent substrate 11.

In the embodiment, the driver ICs 40 may be in signal connection with the pixel unit 12 by a plurality of means, for instance, by connecting lines. For instance, a via hole 25 is formed in the transparent substrate 11 and provided with a conductive material 26; and output ends of the driver ICs 40 are in signal connection with the source electrode 23 through the conductive material 26. Where the pixel unit 12 comprises the gate insulating layer 27, a through hole corresponding to the via hole 25 is formed on the gate insulating layer 27; and the conductive material 26 is connected with the source electrode 23 after passing through the via hole 25 and the through hole.

In the embodiment, the conductive material 26 for connecting the driver ICs 40 and the pixel units 12 may employ a plurality of conductive materials 26, for instance, metal or graphite. The metal may be metals or alloy materials with good electric conductivity such as copper, aluminum or the like.

In the embodiment, the transparent substrate 11 may be a substrate made of a plurality of transparent materials. For instance, the transparent substrate 11 is a resin plate.

Figure 2B:
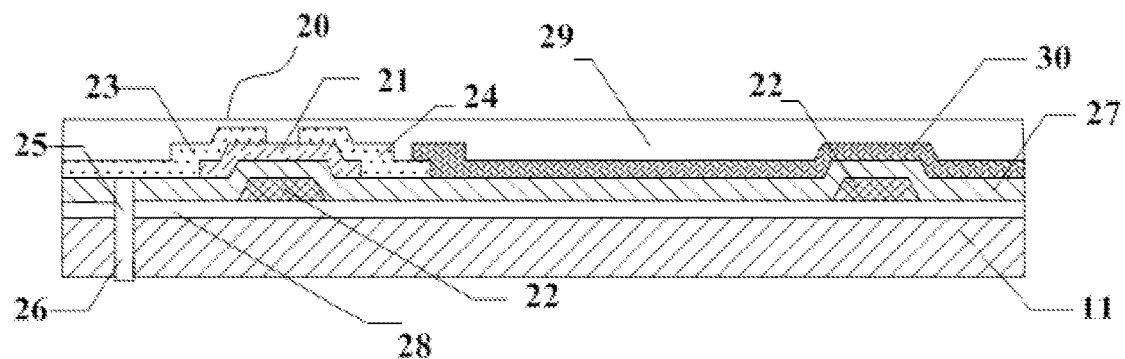
FIG. 2B is a schematic structural view of a pixel unit of the array substrate provided by another embodiment of the present invention.

In the embodiment, in order to improve the safety of the pixel unit 12 and protect the pixel unit 12 from being damaged, for instance, the pixel unit 12 may further include a protective layer 28 disposed between the transparent substrate 11 and the gate electrodes 22, as shown in FIG. 2B.

In the embodiment, in order to improve the safety of the array substrate and protect the pixel units 12 on the array substrate from being damaged so that the performance of the array substrate cannot be degraded, for instance, the array substrate may further comprise a passivation layer 29 disposed on a plurality of the pixel units 12, as shown in FIG. 2B. The passivation layer 29 is, for instance, prepared by an inorganic or organic insulating layer.

The OLED display device provided by an embodiment of the present invention comprises the array substrate according to any one of the above examples, and has good driving capability and good image display brightness.

In the embodiment of the present invention, the driver ICs are disposed on a bottom surface of the TFT substrate, so that the limited space in the OLED display device can hold more driver ICs, and hence the driver ICs can have enough driving capability to drive the pixel units, and consequently the image brightness displayed by the OLED display device can become more uniform.

The foregoing is only the preferred embodiments of the present invention and not intended to limit the scope of protection of the present invention. The scope of protection of the present invention should be defined by the appended claims.

The invention claimed is:

1. An array substrate comprising: a thin-film transistor (TFT) substrate and a plurality of driver integrated circuits (ICs), wherein the TFT substrate comprises a substrate and a plurality of pixel units disposed on one surface of the substrate; the driver ICs are disposed on the other surface of the substrate and configured to transmit signals to the pixel units, and via holes provided with a conductive material are formed in the substrate and the conductive material is protruded out from the via holes and a protruding portion of the conductive material is connected with output ends of the driver ICs, the pixel units comprise TFTs and pixel electrodes; and the TFTs comprise gate electrodes, active layers, source electrodes and drain electrodes, the gate electrodes are disposed on the substrate; the active layers are disposed over the gate electrodes; channels are provided between the source electrodes and the drain electrodes; the drain electrodes are connected with the pixel electrodes, the pixel units further comprise a gate insulating layer disposed between the gate electrodes and the active layers; through holes corresponding to the via holes are formed in the gate insulating layer and provided with the conductive material, the through holes only pass through the gate insulating layer and the conductive material is in connection with the source electrodes through the via holes and the through holes.

2. The array substrate according to claim 1, wherein the driver ICs transmit the signals to the pixel units through the source electrodes.

3. The array substrate according to claim 2, wherein output ends of the driver ICs are in signal connection with the source electrodes through the conductive material.

4. The array substrate according to claim 2, wherein the conductive material is metal or graphite.

5. The array substrate according to claim 2, wherein the pixel units further comprise a protective layer disposed between the substrate and the gate electrodes; and through holes corresponding to the via holes are formed on the protective layer.

6. The array substrate according to claim 1, wherein the driver ICs are welded on the substrate.

7. The array substrate according to claim 6, wherein the substrate is a resin plate.

8. The array substrate according to claim 1, further comprising a passivation layer covering the pixel units.

9. An organic light-emitting diode (OLED) display device, comprising an array substrate, which comprises: a thin-film transistor (TFT) substrate and a plurality of driver integrated circuits (ICs), wherein the TFT substrate comprises a substrate and a plurality of pixel units disposed on one surface of the substrate; the driver ICs are disposed on the other surface of the substrate and configured to transmit signals to the pixel units; and via holes provided with a conductive material are formed in the substrate and the conductive material is protruded out from the via holes and a protruding portion of the conductive material is connected with output ends of the driver ICs, the pixel units comprise TFTs and pixel electrodes; and the TFTs comprise gate electrodes, active layers, source electrodes and drain electrodes, the gate electrodes are disposed on the substrate; the active layers are disposed over the gate electrodes; channels are provided between the source electrodes and the drain electrodes; the drain electrodes are connected with the pixel electrodes, the pixel units further comprise a gate insulating layer disposed between the gate electrodes and the active layers; through holes corresponding to the via holes are formed in the gate insulating layer and provided with the conductive material, the through holes only pass through the gate insulating layer and the conductive material is in connection with the source electrodes through the via holes and the through holes.

10. The OLED display device to claim 9, wherein the driver ICs transmit the signals to the pixel units through the source electrodes.

11. The OLED display device to claim 10, wherein output ends of the driver ICs are in signal connection with the source electrodes through the conductive material.

12. The OLED display device to claim 10, wherein the conductive material is metal or graphite.

13. The OLED display device to claim 11, wherein the pixel units further comprise a protective layer disposed between the substrate and the gate electrodes; and through holes corresponding to the via holes are formed on the protective layer.

14. The OLED display device to claim 9, wherein the driver ICs are welded on the substrate.

15. The OLED display device to claim 14, wherein the substrate is a resin plate.

16. The OLED display device to claim 9, further comprising a passivation layer covering the pixel units.

* * * * *